United States Patent [19]
Asada et al.

[11] Patent Number: 5,964,918
[45] Date of Patent: Oct. 12, 1999

[54] PROCESS FOR PREPARING METAL POWDER

[75] Inventors: Eiichi Asada, Tokyo; Yuji Akimoto, Fukuoka; Kazuro Nagashima, Ohnojo; Mineto Iwasaki, Tosu, all of Japan

[73] Assignee: Shoei Chemical Inc., Tokyo, Japan

[21] Appl. No.: 08/933,908

[22] Filed: Sep. 23, 1997

[30] Foreign Application Priority Data

Sep. 25, 1996 [JP] Japan .................................. 8-272924

[51] Int. Cl.$^6$ ...................................................... B22F 9/24
[52] U.S. Cl. ................................ 75/351; 75/368; 75/369
[58] Field of Search ............................. 75/332, 351, 368, 75/369, 370, 371

[56] References Cited

U.S. PATENT DOCUMENTS

| | | | |
|---|---|---|---|
| 3,850,612 | 11/1974 | Montino et al. | 75/370 |
| 3,962,139 | 6/1976 | van de Moesdijk et al. | 75/351 |
| 4,600,604 | 7/1986 | Siuta | 427/216 |
| 4,748,737 | 6/1988 | Charles et al. | 75/370 |
| 4,960,647 | 10/1990 | Grundy | 428/472 |
| 5,402,305 | 3/1995 | Asada et al. | 361/305 |
| 5,429,657 | 7/1995 | Glicksman et al. | 75/351 |
| 5,439,502 | 8/1995 | Kodas et al. | 75/365 |

FOREIGN PATENT DOCUMENTS

| | | |
|---|---|---|
| 0 091 109 | 10/1983 | European Pat. Off. . |
| 0 591 881 A1 | 4/1994 | European Pat. Off. . |
| 0 591 882 A1 | 4/1994 | European Pat. Off. . |
| 60-24301 | 7/1985 | Japan . |
| 63-31522 | 6/1988 | Japan . |
| 4-202602 | 11/1990 | Japan . |
| 6-172802 | 6/1994 | Japan . |
| 6-279816 | 10/1994 | Japan . |

*Primary Examiner*—George Wyszomierski
*Attorney, Agent, or Firm*—Flynn, Thiel, Boutell & Tanis, P.C.

[57] ABSTRACT

A process for preparing a metal powder, comprising the steps of: bringing a solution comprising at least one metal salt to fine droplets; and heating the droplets to a temperature above the decomposition temperature of the metal salt, wherein at least one compound which is heat-decomposable to produce a metal, a semimetal or an oxide of the metal or semimetal capable of remaining unmelted upon heating at the heat temperature is added to the solution and at least one selected from the group consisting of the metal, semimetal and oxide is heat-segregated in the vicinity of the surface of the metal powder. The resultant metal powder has a uniform particle size and good dispersibility without fusing or aggregation and is useful for the preparation of thick film pastes used in electronic circuits or components.

9 Claims, No Drawings

PROCESS FOR PREPARING METAL POWDER

BACKGROUND OF THE INVENTION

1. Field of the Invention

The present invention relates to a process for preparing a metal powder and particularly to a process for preparing a metal powder useful for a thick film paste.

2. Description of the Prior Art

In the field of electronics, thick film pastes, such as conductor pastes and resistor pastes, have been used for the production of electronic circuits and components, such as resistors, capacitors, and IC packages. The thick film paste is prepared by homogeneously mixing and dispersing a conductive powder, such as a metal, an alloy, or a metal oxide, optionally together with a vitreous binder or other additive(s), in an organic vehicle to prepare a paste. The paste, after application onto a substrate, is baked at a high temperature or heat cured at a relatively low temperature to form a conductor film or a resistor film.

The metal powder or alloy powder used in the above thick film paste is required to have the following properties.

(1) Good dispersibility, in a paste, enough to form a dense, uniform film.

(2) Low content of impurities having adverse effect on electric characteristics.

(3) Sufficient crystallinity to offer a proper sinterability.

(4) Particles having a particle size of from about 0.1 to 10 $\mu$m and a uniform shape.

Conventional processes for preparing the above metal powder include a spray pyrolysis method described in Japanese Patent Publication No. 31522/1988, Japanese Patent Laid-Open Nos. 172802/1994 and 279816/1994 and the like. According to this method, a solution containing at least one metal salt is atomized to form droplets which are then heated at a temperature above the decomposition temperature of the metal salt, preferably a temperature around the melting point of the metal or above to heat-decompose the metal salt, thereby depositing a metal or alloy powder.

According to the spray pyrolysis method, a metal or alloy powder can be easily prepared which, as compared with a metal or alloy powder prepared by wet reduction or the like, has better crystallinity, higher density and higher purity and possesses properties suitable for a thick film paste. The particle size of the metal powder can be controlled by properly setting the concentration of the metal salt, solvent, atomization and heating conditions, etc. Further, since the metal composition of the resultant particles is in agreement with that of the starting metal salt in the starting solution, making it easy to control the composition, which in turn renders the spray pyrolysis method suitable for the preparation of a multi-component powder.

In general, the spray pyrolysis method can provide a powder having very good dispersibility because metal particles are prepared in a vapor phase under such conditions that the particle concentration is relatively low. Exposure to a very high temperature in the course of formation of a metal powder, however, is likely to cause fusing among particles, sintering and aggregation depending upon various conditions such as remarkable increase in particle concentration or formation of the particle in a turbulent gas stream, even when the temperature is not above the melting point. Also, in the step of cooling the resultant powder, strong aggregation among particles often occurs in some handling methods. In many cases, it is difficult to break the aggregates into particles, leading to poor dispersibility in a paste. Further, fusing or aggregation of the powder causes adhesion or deposition in the production apparatus or requires classification of the aggregate, resulting in a reduction in yield of the product and, in addition, rendering continuous operation difficult. This phenomenon is significant and, hence, raises a problem, particularly in metals having a relatively low melting point, such as a silver powder or an alloy powder having a high silver content.

SUMMARY OF THE INVENTION

An object of the present invention is to effectively prevent the above aggregation without rendering the process and operation complicated.

According to the present invention, in the step of forming a metal powder by spray pyrolysis, a high-melting metal or metal oxide or the like is segregated, simultaneously with the formation of the metal powder, mainly on the surface of the metal powder, thereby preventing fusing and aggregation among the resultant particles.

Thus, according to the present invention, there is provided a process for preparing a metal powder, comprising the steps of: bringing a solution comprising at least one metal salt to fine droplets; and heating the droplets to a temperature above the decomposition temperature of the metal salt, wherein at least one compound which is heat-decomposable to produce a metal, a semimetal or an oxide of the metal or semimetal (hereinafter referred to as "metal or the like") capable of remaining unmelted upon heating at the heat temperature is added to the solution and at least one "metal or the like" is heat-segregated in the vicinity of the surface of the metal powder.

DETAILED DESCRIPTION OF THE PREFERRED EMBODIMENTS

In the present invention, examples of the metal (major metal) to be coated with the "metal or the like" include noble metals, such as silver, gold, platinum, and palladium, and base metals, such as copper, nickel, cobalt, iron, aluminum, molybdenum, and tungsten and these metals may be in any one form of simple metal or alloy or mixture thereof. The present invention is useful particularly for a silver powder and a powder of a silver alloy, such as silver-palladium.

The starting salt of the metal powder may be at least one heat decomposable salt selected from the group consisting of a salt of nitric acid, a salt of sulfuric acid, a chloride, an ammonium complex, a salt of phosphoric acid, a salt of carboxylic acid, a metal alcoholate, and a metal resinate, or a double salt or complex salt. Use of a mixture of at least two metal salts can offer an alloy or mixed powder.

The "metal or the like" to be segregated on the surface of the metal powder should not melt under conditions for forming a metal powder according to the present invention and hardly dissolves, in solid solution form, in the metal powder. For example, when the preparation of a silver or silver alloy powder is contemplated, examples of the "metal or the like" include metals, such as rhodium, osmium, iridium, platinum, iron, cobalt, nickel, chromium and molybdenum, and oxides of ruthenium, iron, cobalt, nickel, copper, zinc, cadmium, alkaline earth metals, boron, aluminum, silicon, germanium, lead, bismuth, rare earth metals, titanium, zirconium, vanadium, niobium, tantalum, chromium, molybdenum, tungsten, and manganese.

Depending upon the metal powder to be combined, even a metal or semimetal element, which is dissolved in solid solution form in a steady state, may be used by properly selecting and setting reaction conditions that hardly cause dissolution in solid solution form in the interior of the particle, such as heat decomposition temperature, reaction time, atmosphere, and amount of the element added, in the preparation of the metal powder by heat decomposition. For example, in the case of elements, which are dissolved in solid solution form in the form of a metal but not dissolved in solid solution form in the form of an oxide, heat decomposition may be carried out under such conditions that the additive element alone is oxidized.

The metal powder prepared by the spray pyrolysis has good crystallinity, is free from a defect in the interior of the particle, and includes substantially no grain boundary. Therefore, the "metal or the like" decomposed and deposited from the added compound, simultaneously with the formation of the metal particle, is expelled from the interior of the particle, resulting in segregation in a high concentration around the surface of the particle. Even though a small part of the "metal or the like", decomposed and deposited from the added compound, is dissolved in solid solution form in the metal as the major component and remains in the interior of the particle, this is not detrimental to the effect of the present invention so far as most of the "metal or the like" is segregated on the surface of the particle.

The compound to be added is heat decomposable and a precursor of the above-mentioned "metal or the like" may be used. It may be appropriately selected from, for example, the group consisting of a salt of boric acid, a salt of silicic acid, a salt of nitric acid, a salt of sulfuric acid, a chloride, an ammonium complex, a salt of phosphoric acid, a salt of carboxylic acid, a metal alcoholate, a metal resinate, a double salt, and a complex salt.

There is no need for the metal powder to be entirely coated with the "metal or the like" which has been decomposed and deposited from the compound. The deposition of the "metal or the like" in a very small amount on the metal powder suffices for the effect of preventing the fusing. The amount of the metal or semimetal element added may be not less than 50 ppm in total based on the metal as the major component of the powder. The upper limit of the amount is not particularly limited. Since, however, the amount of the metal or semimetal element included in the interior of the particles increases with increasing the amount of the metal or semimetal added, the upper limit of the amount is preferably about 5%.

The effect of retarding sintering during firing of the paste can be also expected depending upon the kind or amount of deposition of the metal or semimetal element added. Deposition in an excessive amount, however, results in a deteriorated degree of sintering and conductivity or increased amount of impurities, which is often detrimental to the electric characteristics. For this reason, if necessary, after the formation of the powder, a part or substantially the whole of the "metal or the like" deposited on the surface of the metal powder may be removed by washing, etching or other method to reduce the impurity content. In general, no problem is raised when the amount of the "metal or the like" remaining on the surface of the metal powder is in the range of from 50 to 2,000 ppm, preferably 100 to 1,000 ppm, based on the weight of the metal powder, excluding the "metal or the like" deposited thereon. Throughout this specification, the amount of the "metal or the like" is indicated based on the metal as the major component (excluding the "metal or the like") of the powder unless otherwise specified.

The metal salt as the major component and the compound as the additive are dissolved in water or an organic solvent, such as alcohol, acetone or ether, or a mixed solvent thereof to prepare, for example, a metal salt mixture solution which is brought to fine droplets through an atomizer, such as an ultrasonic atomizer or a twin-fluid atomizer, followed by heating at a temperature above the decomposition temperature of the metal salt to conduct heat decomposition. Preferably, the heating treatment is conducted at the melting point of the metal or alloy as the major component or a higher temperature. However, when high density, uniform shape or the like is not required, the heating temperature may be below the melting point. The atmosphere at the time of heating may be suitably selected from oxidizing, reducing and inert atmospheres depending upon the kind of the metal and the metal or semimetal added, heating temperature and the like.

The present invention will be described in more detail with reference to the following examples, though it is not limited to these examples only.

EXAMPLES 1 to 4

Silver nitrate and copper nitrate trihydrate are dissolved in water to prepare aqueous solutions having a silver concentration of 50 to 100 g/liter or a copper concentration of 10 to 500 ppm (100 to 1,000 ppm based on silver) as specified in Table 1. The solution thus prepared was brought to droplets through an ultrasonic atomizer, and the droplets were sprayed with the aid of air as a carrier gas into a ceramic tube heated to 1,000 to 1,100° C. in an electric furnace. The droplets were heat decomposed in the course of passing through a heating zone to prepare a silver powder. The resultant powder was collected, and the average particle size of the powder was measured with a laser-scattering particle size distribution analyzer. The results are given in Table 1. Further, the powder was dissolved in nitric acid, and the concentration of copper in the powder was determined by ICP (inductively coupled plasma emission spectroscopy). As a result, the copper concentration was in agreement with that in the starting composition. It was confirmed that copper was deposited in the form of copper oxide.

The powder, prepared in Example 2, with the amount of copper added being 200 ppm based on silver was dispersed in and washed with 3% sulfuric acid. As a result, the amount of dissolved silver was as small as 560 ppm based on the weight of the powder, whereas the amount of dissolved copper was 125 ppm, indicating that most of the added copper was eluted. The above results show that the added copper was segregated in a high concentration on the surface of the silver powder.

Comparative Example 1

A pure silver powder was prepared in the same manner as in Example 1, except that no copper nitrate trihydrate was added. The powder thus prepared was in a remarkably aggregated state, and the average particle size could not be measured with a laser-scattering particle size distribution analyzer.

EXAMPLE 5

The procedure of Example 1 was repeated, except that, instead of the copper nitrate trihydrate, nickel nitrate hexahydrate was added in an amount as specified in Table 1. Thus, a silver powder with nickel oxide segregated on the surface thereof was prepared. The average particle size was as given in Table 1.

EXAMPLE 6

The procedure of Example 1 was repeated, except that, instead of the copper nitrate trihydrate, rhodium nitrate dihydrate was added in an amount as specified in Table 1 and the heating temperature was changed to 900° C. Thus, a silver powder with metallic rhodium segregated on the surface thereof was prepared. The average particle size was as given in Table 1.

EXAMPLE 7

An aqueous silver nitrate solution and an aqueous palladium nitrate solution were mixed together so that the silver to palladium ratio by weight was 9:1. Further, copper nitrate trihydrate was added to the mixture to prepare a solution including silver and palladium in their total concentration of 50 g/liter and copper in a concentration of 10 ppm (200 ppm with respect to the total amount of silver and palladium). The procedure of Example 1 was repeated, except that the heating temperature was 1,200° C. Thus, a silver-palladium alloy powder with copper oxide segregated on the surface thereof was prepared. The average particle size was as given in Table 1.

Comparative Example 2

A silver-palladium alloy powder was prepared in the same manner as in Example 7, except that no copper nitrate trihydrate was added. The average particle size was as given in Table 1.

As is apparent from Table 1, the metal powders prepared according to the process of the present invention contained no significant amount of aggregate and had properties showing a very good suitability as a powder for a thick film paste.

The metal powder prepared according to the process of the present invention can be used for, besides the thick film paste, decoration, catalyst, powder metallurgy, magnetic material and other applications.

What is claimed is:

1. A process for preparing a metal powder by spray pyrolysis, comprising the steps of: bringing a solution comprising at least one metal salt to fine droplets and heating the droplets to a temperature above the decomposition temperature of the metal salt to produce the metal powder, wherein at least one compound which is heat-decomposable to produce a metal, a semimetal or an oxide of the metal or semimetal capable of not melting at the heating temperature is added to the solution and at least one member selected from the group consisting of the metal, semimetal and oxide thereof is heat-segregated on the surface of the metal powder.

2. The process according to claim 1, which further comprises the step of removing at least a part of the segregated metal, semimetal or oxide thereof.

3. The process according to claim 1, wherein the total amount of the metal or semimetal in the compound added is not less than 50 ppm based on the weight of the metal in the metal salt.

4. A process for preparing a silver or silver alloy powder by spray pyrolysis comprising the steps of: bringing a solution comprising at least one silver salt to fine droplets and heating the droplets to a temperature above the decomposition temperature of the silver salt to produce the silver or silver alloy powder, wherein at least one compound which is heat-decomposable to produce a metal, a semimetal or an

TABLE 1

| | Metal powder | Metal concentration (g/liter) | Additive element | Amount of additive element based on metal (ppm) | Heating temperature (° C.) | Particle size (βm) | |
| --- | --- | --- | --- | --- | --- | --- | --- |
| | | | | | | D50 | D90 |
| Ex. 1 | Ag | 100 | Cu | 100 | 1000 | 1.78 | 3.38 |
| Ex. 2 | Ag | 100 | Cu | 200 | 1000 | 1.11 | 1.68 |
| Ex. 3 | Ag | 50 | Cu | 200 | 1100 | 0.99 | 1.58 |
| Ex. 4 | Ag | 50 | Cu | 1000 | 1100 | 0.79 | 1.28 |
| Comparative Ex. 1 | Ag | 100 | None | — | 1000 | Impossible to measure due to remarkablqe aggregation | |
| Ex. 5 | Ag | 100 | Ni | 20000 | 1000 | 1.49 | 2.16 |
| Ex. 6 | Ag | 100 | Rh | 500 | 900 | 0.83 | 1.80 |
| Ex. 7 | Ag—Pd alloy (Ag:Pd = 9:1) | 50 | Cu | 200 | 1200 | 1.12 | 1.62 |
| Comparative Ex. 2 | Ag—Pd alloy (Ag:Pd = 9:1) | 50 | None | — | 1200 | 1.32 | 1.93 |

According to the present invention, in the preparation of a metal powder by spray pyrolysis, fusing among formed particles can be effectively prevented, and a metal powder having a uniform particle size and good dispersibility can be prepared.

Addition of "metal or the like" in a very small amount suffices for attaining the contemplated effect. Further, unnecessary portion of the "metal or the like" can be removed by washing after the preparation of the powder, offering a minimized impurity content and avoiding an adverse effect on conductivity, solderability and the like when the powder is used for a thick film paste. Further, in the spray pyrolysis, the composition of the metal and semimetal element in the starting solution is basically in agreement with the composition in the formed particle, making it easy to regulate the amount of the "metal or the like" added.

oxide of the metal or semimetal capable of not melting at the heating temperature is added to the solution and at least one member selected from the group consisting of the metal, semimetal and oxide thereof is heat-segregated on the surface of the silver or silver alloy powder.

5. The process according to claim 4, wherein the metal, semimetal, or oxide thereof is selected from the group consisting of ruthenium, rhodium, osmium, iridium, platinum, iron, cobalt, nickel, copper, zinc, cadmium, alkaline earth metals, boron, aluminum, silicon, germanium, lead, bismuth, rare earth metals, titanium, zirconium, vanadium, niobium, tantalum, chromium, molybdenum, tungsten, and manganese and oxides thereof.

6. The process according to claim 4, wherein said alloy is a silver-palladium alloy.

7. The process according to claim 4, wherein the amount of the metal or semimetal is not less than 50 ppm based on the silver or silver alloy.

8. The process according to claim 4, wherein said metal is copper.

9. The process of claim 4, which further comprises the step of removing at least a part of the segregated metal, semimetal or oxide thereof.

* * * * *